United States Patent [19]

Murayama et al.

[11] Patent Number: 5,032,838
[45] Date of Patent: Jul. 16, 1991

[54] VARIABLE LENGTH CODE PARALLEL DECODING APPARATUS AND METHOD

[75] Inventors: Masayoshi Murayama; Fumitaka Sato; Kensuke Adachi, all of Oome; Shigekazu Sumita, Chiba, all of Japan

[73] Assignee: Kabushiki Kaisha Toshiba, Kawasaki, Japan

[21] Appl. No.: 428,287

[22] Filed: Oct. 26, 1989

[30] Foreign Application Priority Data

Apr. 6, 1989 [JP] Japan .................................. 1-87337

[51] Int. Cl.⁵ ........................................... H03M 7/40
[52] U.S. Cl. ...................................... 341/67; 341/95; 358/261.1
[58] Field of Search ................ 341/67, 59, 65, 79, 341/95, 106, 107; 358/261.1, 261.2, 261.4

[56] References Cited

U.S. PATENT DOCUMENTS

| 3,883,847 | 5/1975 | Frank | 340/146.1 R |
|---|---|---|---|
| 4,739,308 | 4/1988 | Lienard | 341/67 |
| 4,760,459 | 7/1988 | Sato | 358/260 |
| 4,760,461 | 7/1988 | Sato | 358/261 |
| 4,800,441 | 1/1989 | Sato | 358/261.1 |
| 4,899,149 | 2/1990 | Kahan | 341/67 |

FOREIGN PATENT DOCUMENTS

| 227377 | 3/1987 | Japan . |
|---|---|---|
| 235825 | 7/1988 | Japan . |
| 276973 | 11/1988 | Japan . |
| 299520 | 12/1988 | Japan . |

OTHER PUBLICATIONS

Sieminski, Fast Decoding of the Huffman Codes, Information Processing Letters 26 (1987/88), pp. 237-241.

Primary Examiner—A. D. Pellinen
Assistant Examiner—Brian K. Young
Attorney, Agent, or Firm—Cushman, Darby & Cushman

[57] ABSTRACT

When a variable length code requires two cycles in decoding, portions of code bit strings serving as objects to be decoded in first and second cycles of the variable length code are caused to overlap each other. In the first cycle, a non-overlapping portion is determined as a decoded portion. A length of a code bit string actually decoded in the first cycle is determined as a length of the code bit string serving as the object to be decoded in the first cycle excluding the length of the overlapping portion so as to determine a start position of the code bit string serving as the object to be decoded in the second cycle.

16 Claims, 13 Drawing Sheets

FIG. 1A (PRIOR ART)

TERMINATING CODE

| WHITE RUN LENGTH | WHITE CODE | BLACK RUN LENGTH | BLACK CODE |
|---|---|---|---|
| 0 | 00110101 | 0 | 0000110111 |
| 1 | 000111 | 1 | 010 |
| 2 | 0111 | 2 | 11 |
| 3 | 1000 | 3 | 10 |
| 4 | 1011 | 4 | 011 |
| 5 | 1100 | 5 | 0011 |
| 6 | 1110 | 6 | 0010 |
| 7 | 1111 | 7 | 00011 |
| 8 | 10011 | 8 | 000101 |
| 9 | 10100 | 9 | 000100 |
| 10 | 00111 | 10 | 0000100 |
| 11 | 01000 | 11 | 0000101 |
| 12 | 001000 | 12 | 0000111 |
| 13 | 000011 | 13 | 00000100 |
| 14 | 110100 | 14 | 00000111 |
| 15 | 110101 | 15 | 000011000 |
| 16 | 101010 | 16 | 0000010111 |
| 17 | 101011 | 17 | 0000011000 |
| 18 | 0100111 | 18 | 0000001000 |
| 19 | 0001100 | 19 | 00001100111 |
| 20 | 0001000 | 20 | 00001101000 |
| 21 | 0010111 | 21 | 00001101100 |
| 22 | 0000011 | 22 | 00000110111 |
| 23 | 0000100 | 23 | 00000101000 |
| 24 | 0101000 | 24 | 00000010111 |
| 25 | 0101011 | 25 | 00000011000 |
| 26 | 0010011 | 26 | 000011001010 |
| 27 | 0100100 | 27 | 000011001011 |
| 28 | 0011000 | 28 | 000011001100 |
| 29 | 00000010 | 29 | 000011001101 |
| 30 | 00000011 | 30 | 000001101000 |
| 31 | 00011010 | 31 | 000001101001 |

WHITE A

BLACK A
BLACK B
BLACK C
BLACK D
BLACK E
BLACK F
BLACK C
BLACK B
BLACK E
BLACK D
BLACK F
BLACK G
BLACK C
BLACK E

FIG. 1B (PRIOR ART)

| WHITE RUN LENGTH | WHITE CODE | BLACK RUN LENGTH | BLACK CODE | |
|---|---|---|---|---|
| 32 | 00011011 | 32 | 0000001101010 | BLACK E |
| 33 | 00010010 | 33 | 0000001101011 | |
| 34 | 00010011 | 34 | 0000011010010 | BLACK B |
| 35 | 00010100 | 35 | 0000011010011 | |
| 36 | 00010101 | 36 | 0000011010100 | BLACK E |
| 37 | 00010110 | 37 | 0000011010101 | |
| 38 | 00010111 | 38 | 0000011010110 | BLACK B |
| 39 | 00101000 | 39 | 0000011010111 | |
| 40 | 00101001 | 40 | 0000001101100 | BLACK D |
| 41 | 00101010 | 41 | 0000001101101 | |
| 42 | 00101011 | 42 | 0000011011010 | BLACK E |
| 43 | 00101100 | 43 | 0000011011011 | |
| 44 | 00101101 | 44 | 0000001010100 | BLACK D |
| 45 | 00000100 | 45 | 0000001010101 | |
| 46 | 00000101 | 46 | 0000001010110 | BLACK E |
| 47 | 00001010 | 47 | 0000001010111 | |
| 48 | 00001011 | 48 | 0000001100100 | BLACK D |
| 49 | 01010010 | 49 | 0000001100101 | |
| 50 | 01010011 | 50 | 0000001010010 | BLACK F |
| 51 | 01010100 | 51 | 0000001010011 | BLACK G |
| 52 | 01010101 | 52 | 0000000100100 | BLACK F |
| 53 | 00100100 | 53 | 0000000110111 | |
| 54 | 00100101 | 54 | 0000000111000 | |
| 55 | 01011000 | 55 | 0000000100111 | BLACK D |
| 56 | 01011001 | 56 | 0000000101000 | |
| 57 | 01011010 | 57 | 0000001011000 | BLACK F |
| 58 | 01011011 | 58 | 0000001011001 | |
| 59 | 01001010 | 59 | 0000000101011 | BLACK D |
| 60 | 01001011 | 60 | 0000000101100 | |
| 61 | 00110010 | 61 | 0000001011010 | BLACK D |
| 62 | 00110011 | 62 | 0000001100110 | |
| 63 | 00110100 | 63 | 0000001100111 | BLACK E |

FIG. 2 (PRIOR ART)

| WHITE RUN LENGTH | WHITE CODE | | BLACK RUN LENGTH | BLACK CODE | |
|---|---|---|---|---|---|
| | | | MAKE-UP CODE | | |
| 64 | 11011 | WHITE A | 64 | 0000001111 | BLACK A |
| 128 | 10010 | | 128 | 000011001000 | BLACK C |
| 192 | 010111 | WHITE B | 192 | 000011001001 | BLACK D |
| 256 | 0110111 | WHITE C | 256 | 000001011011 | |
| 320 | 00110110 | WHITE D | 320 | 000000110011 | BLACK G |
| 384 | 00110111 | | 384 | 000000110100 | |
| 448 | 01100100 | | 448 | 000000110101 | |
| 512 | 01100101 | WHITE E | 512 | 0000001101100 | |
| 576 | 01101000 | | 576 | 0000001101101 | |
| 640 | 01100111 | WHITE F | 640 | 0000001001010 | BLACK F |
| 704 | 011001100 | | 704 | 0000001001011 | |
| 768 | 011001101 | | 768 | 0000001001100 | |
| 832 | 011010010 | WHITE G | 832 | 0000001001101 | |
| 896 | 011010011 | | 896 | 0000001110010 | BLACK G |
| 960 | 011010100 | | 960 | 0000001110011 | |
| 1024 | 011010101 | | 1024 | 0000001110100 | |
| 1088 | 011010110 | | 1088 | 0000001110101 | |
| 1152 | 011010111 | | 1152 | 0000001110110 | BLACK F |
| 1216 | 011011000 | | 1216 | 0000001110111 | |
| 1280 | 011011001 | | 1280 | 0000001010010 | |
| 1344 | 011011010 | WHITE H | 1344 | 0000001010011 | |
| 1408 | 011011011 | | 1408 | 0000001010100 | |
| 1472 | 010011000 | WHITE I | 1472 | 0000001010101 | |
| 1536 | 010011001 | | 1536 | 0000001011010 | |
| 1600 | 010011010 | WHITE J | 1600 | 0000001011011 | BLACK G |
| 1664 | 011000 | | 1664 | 0000001100100 | |
| 1728 | 010011011 | | 1728 | 0000001100101 | |
| EOL | 000000000001 | | EOL | 000000000001 | BLACK H |

MAKE-UP CODE

| WHITE/BLACK RUN LENGTH | WHITE/BLACK CODE | |
|---|---|---|
| 1792 | 00000001 000 | |
| 1856 | 00000001 100 | WHITE A |
| 1920 | 00000001 101 | WHITE K |
| 1984 | 00000001 0010 | |
| 2048 | 00000001 0011 | BLACK 1 |
| 2112 | 00000001 0100 | |
| 2176 | 00000001 0101 | |
| 2240 | 00000001 0110 | |
| 2304 | 00000001 0111 | |
| 2368 | 00000001 1100 | |
| 2432 | 00000001 1101 | |
| 2496 | 00000001 1110 | |
| 2560 | 00000001 1111 | |

F I G. 3

(PRIOR ART)

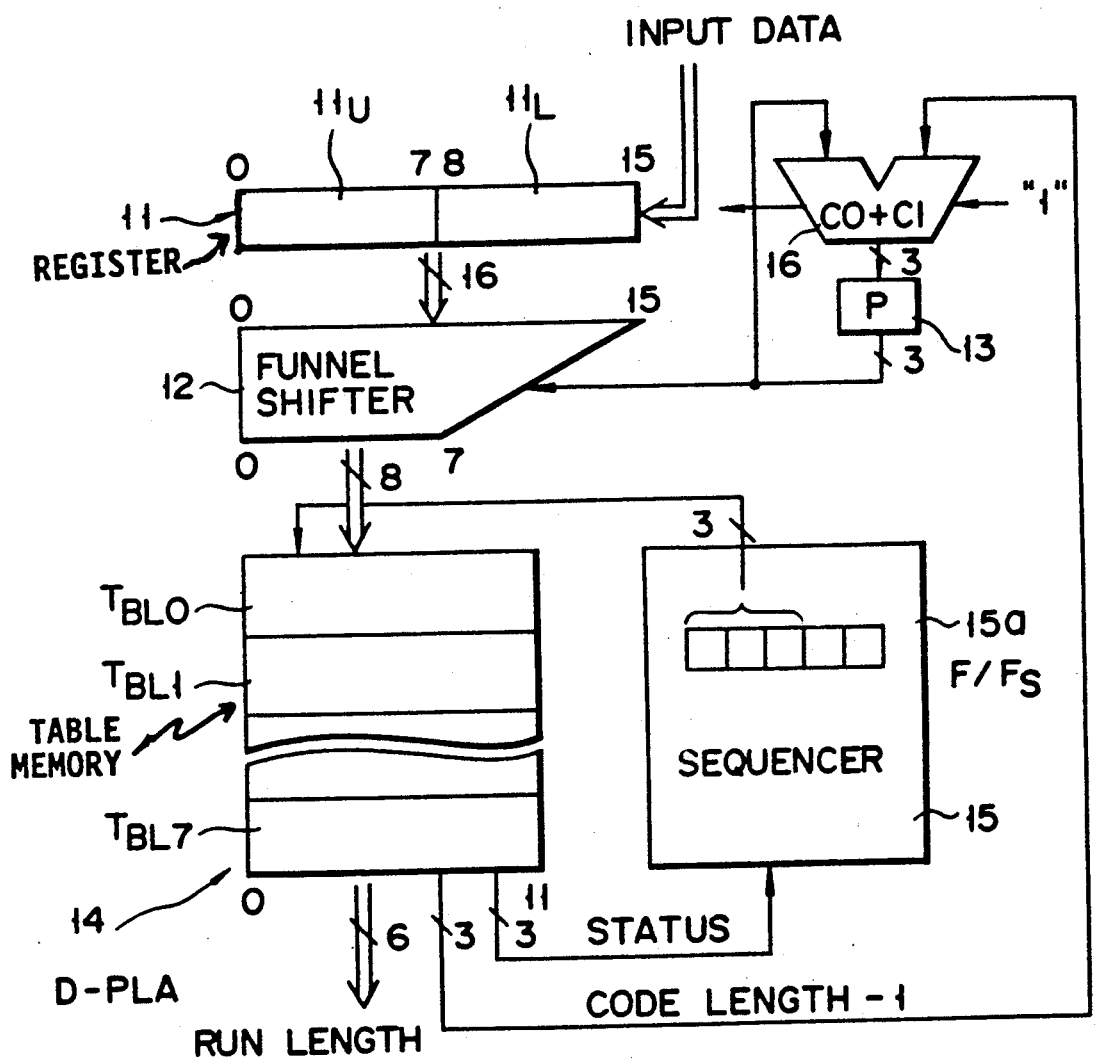
F I G. 4

| INPUT OF D-PLA 14 (UPPER 3 BITS) | TABLE TO BE USED | TABLE ASSIGNMENT |
|---|---|---|
| 0 0 0 | TBL 0 | FOR DECODING IN FIRST CYCLE (WHITE A STATE) OF ONE-DIMENSIONAL WHITE CODE |
| 0 0 1 | TBL 1 | FOR DECODING IN SECOND CYCLE (WHITE B STATE) OF ONE-DIMENSIONAL WHITE CODE OF TYPE 2 |
| 0 1 0 | TBL 2 | FOR DECODING IN FIRST CYCLE (BLACK A STATE) OF ONE-DIMENSIONAL BLACK CODE |
| 0 1 1 | TBL 3 | FOR DECODING IN SECOND CYCLE (BLACK C STATE) OF ONE-DIMENSIONAL WHITE CODE OF TYPE 3 CR ONE-DIMENSIONAL BLACK CODE OF TYPE 2 |
| 1 0 0 | TBL 4 | FOR DECODING IN SECOND CYCLE (BLACK C STATE) OF ONE-DIMENSIONAL BLACK CODE OF TYPE 3 |
| 1 0 1 | TBL 5 | FOR DECODING TWO-DIMENSIONAL CODE |
| 1 1 0 | TBL 6 | FOR DECODING NON-COMPRESSED MODE CODE |
| 1 1 1 | TBL 7 | FOR DECODING SPECIAL CODE (EOL SEARCH ETC.) |

OUTPUT OF SEQUENCER 15
UPPER 3-BITS OF 5-BIT DATA
INDICATING STATUS OF SEQUENCER 15

F I G. 5

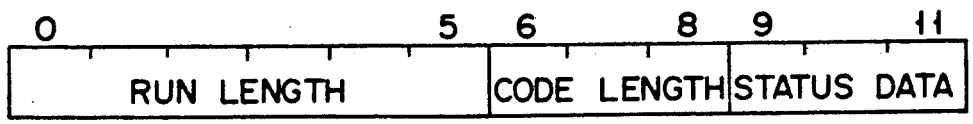

TERMINATING CODE

| WHITE RUN LENGTH | WHITE CODE | BLACK RUN LENGTH | BLACK CODE |
|---|---|---|---|
| 0 | 00110101 | 0 | 0000110111 |
| 1 | 000111 | 1 | 010 |
| 2 | 0111 | 2 | 11 |
| 3 | 1000 | 3 | 10 |
| 4 | 1011 | 4 | 011 |
| 5 | 1100 | 5 | 0011 |
| 6 | 1110 | 6 | 0010 |
| 7 | 1111 | 7 | 00011 |
| 8 | 10011 | 8 | 000101 |
| 9 | 10100 | 9 | 000100 |
| 10 | 00111 | 10 | 0000100 |
| 11 | 01000 | 11 | 0000101 |
| 12 | 001000 | 12 | 0000111 |
| 13 | 000011 | 13 | 00000100 |
| 14 | 110100 | 14 | 00000111 |
| 15 | 110101 | 15 | 000011000 |
| 16 | 101010 | 16 | 0000010111 |
| 17 | 101011 | 17 | 0000011000 |
| 18 | 0100111 | 18 | 0000001000 |
| 19 | 0001100 | 19 | 00001100111 |
| 20 | 0001000 | 20 | 00001101000 |
| 21 | 0010111 | 21 | 00001101100 |
| 22 | 0000011 | 22 | 00000110111 |
| 23 | 0000100 | 23 | 00000101000 |
| 24 | 0101000 | 24 | 00000010111 |
| 25 | 0101011 | 25 | 00000011000 |
| 26 | 0010011 | 26 | 000011001010 |
| 27 | 0100100 | 27 | 000011001011 |
| 28 | 0011000 | 28 | 000011001100 |
| 29 | 00000010 | 29 | 000011001101 |
| 30 | 00000011 | 30 | 000001101000 |
| 31 | 00011010 | 31 | 000001101001 |

White code: TYPE 1

Black code groupings:
- 0: TYPE 3, BLACK C (0000110111)
- 1–9: TYPE 1, BLACK A
- 10–15: TYPE 3
- 16–17: TYPE 3, BLACK C
- 18: TYPE 2, BLACK B
- 19–23: TYPE 3, BLACK C
- 24–25: TYPE 2, BLACK B
- 26–31: TYPE 3, BLACK C

FIG. 7B

| WHITE RUN LENGTH | WHITE CODE | BLACK RUN LENGTH | BLACK CODE |
|---|---|---|---|
| 32 | 00011011 | 32 | 000001101010 |
| 33 | 00010010 | 33 | 000001101011 |
| 34 | 00010011 | 34 | 000011010010 |
| 35 | 00010100 | 35 | 000011010011 |
| 36 | 00010101 | 36 | 000011010100 |
| 37 | 00010110 | 37 | 000011010101 |
| 38 | 00010111 | 38 | 000011010110 |
| 39 | 00101000 | 39 | 000011010111 |
| 40 | 00101001 | 40 | 000001101100 |
| 41 | 00101010 | 41 | 000001101101 |
| 42 | 00101011 | 42 | 000011011010 |
| 43 | 00101100 | 43 | 000011011011 |
| 44 | 00101101 | 44 | 000001010100 |
| 45 | 00000100 | 45 | 000001010101 |
| 46 | 00000101 | 46 | 000001010110 |
| 47 | 00001010 | 47 | 000001010111 |
| 48 | 00001011 | 48 | 000001100100 |
| 49 | 01010010 | 49 | 000001100101 |
| 50 | 01010011 | 50 | 000001010010 |
| 51 | 01010100 | 51 | 000001010011 |
| 52 | 01010101 | 52 | 000000100100 |
| 53 | 00100100 | 53 | 000000110111 |
| 54 | 00100101 | 54 | 000000111000 |
| 55 | 01011000 | 55 | 000000100111 |
| 56 | 01011001 | 56 | 000000101000 |
| 57 | 01011010 | 57 | 000001011000 |
| 58 | 01011011 | 58 | 000001011001 |
| 59 | 01001010 | 59 | 000000101011 |
| 60 | 01001011 | 60 | 000000101100 |
| 61 | 00110010 | 61 | 000001011010 |
| 62 | 00110011 | 62 | 000001100110 |
| 63 | 00110100 | 63 | 000001100111 |

TERMINATING CODE

WHITE A — TYPE 1

BLACK C — TYPE 3
BLACK A
BLACK B — TYPE 2
BLACK C — TYPE 3
BLACK B — TYPE 2
BLACK C — TYPE 3

FIG. 8

MAKE-UP CODE

| WHITE RUN LENGTH | WHITE CODE | | BLACK RUN LENGTH | BLACK CODE |
|---|---|---|---|---|
| 64 | 11011 | WHITE A / TYPE 1 | 64 | 0000001111 | TYPE 2 |
| 128 | 10010 | | 128 | 000011001000 | TYPE 3 / BLACK A |
| 192 | 010111 | | 192 | 000011001001 | |
| 256 | 0110111 | | 256 | 000001011011 | |
| 320 | 00110110 | | 320 | 000000110011 | TYPE 2 |
| 384 | 00110111 | | 384 | 000000110100 | |
| 448 | 01100100 | | 448 | 000000110101 | |
| 512 | 01100101 | | 512 | 0000001101100 | |
| 576 | 01101000 | | 576 | 0000001101101 | |
| 640 | 01100111 | | 640 | 0000001001010 | |
| 704 | 011001100 | WHITE B / TYPE 2 | 704 | 0000001001011 | |
| 768 | 011001101 | | 768 | 0000001001100 | |
| 832 | 011010010 | | 832 | 0000001001101 | |
| 896 | 011010011 | | 896 | 0000001110010 | |
| 960 | 011010100 | | 960 | 0000001110011 | |
| 1024 | 011010101 | | 1024 | 0000001110100 | |
| 1088 | 011010110 | | 1088 | 0000001110101 | |
| 1152 | 011010111 | | 1152 | 0000001110110 | |
| 1216 | 011011000 | | 1216 | 0000001110111 | |
| 1280 | 011011001 | | 1280 | 0000001010010 | |
| 1344 | 011011010 | | 1344 | 0000001010011 | |
| 1408 | 011011011 | | 1408 | 0000001010100 | |
| 1472 | 010011000 | | 1472 | 0000001010101 | |
| 1536 | 010011001 | | 1536 | 0000001011010 | |
| 1600 | 010011010 | TYPE 1 | 1600 | 0000001011011 | |
| 1664 | 011000 | TYPE 2 | 1664 | 0000001100100 | |
| 1728 | 010011011 | | 1728 | 0000001100101 | BLACK B |
| EOL | 000000000001 | WHITE B / TYPE 3 | EOL | 000000000001 | |

TYPE 3

MAKE-UP CODE

| WHITE/BLACK RUN LENGTH | WHITE / BLACK CODE |
|---|---|
| 1792<br>1856<br>1920<br>1984<br>2048<br>2112<br>2176<br>2240<br>2304<br>2368<br>2432<br>2496<br>2560 | WHITE A OR BLACK A →<br>00000000 1000<br>00000000 1100<br>00000000 1101 ← BLACK B<br>00000000 10010<br>00000000 10011<br>TYPE 3 (WHITE) OR<br>00000000 10100<br>00000000 10101<br>00000000 10110<br>TYPE 2 (BLACK)<br>00000000 10111<br>00000000 11100<br>00000000 11101<br>00000000 11110<br>00000000 11111 |

F I G. 9

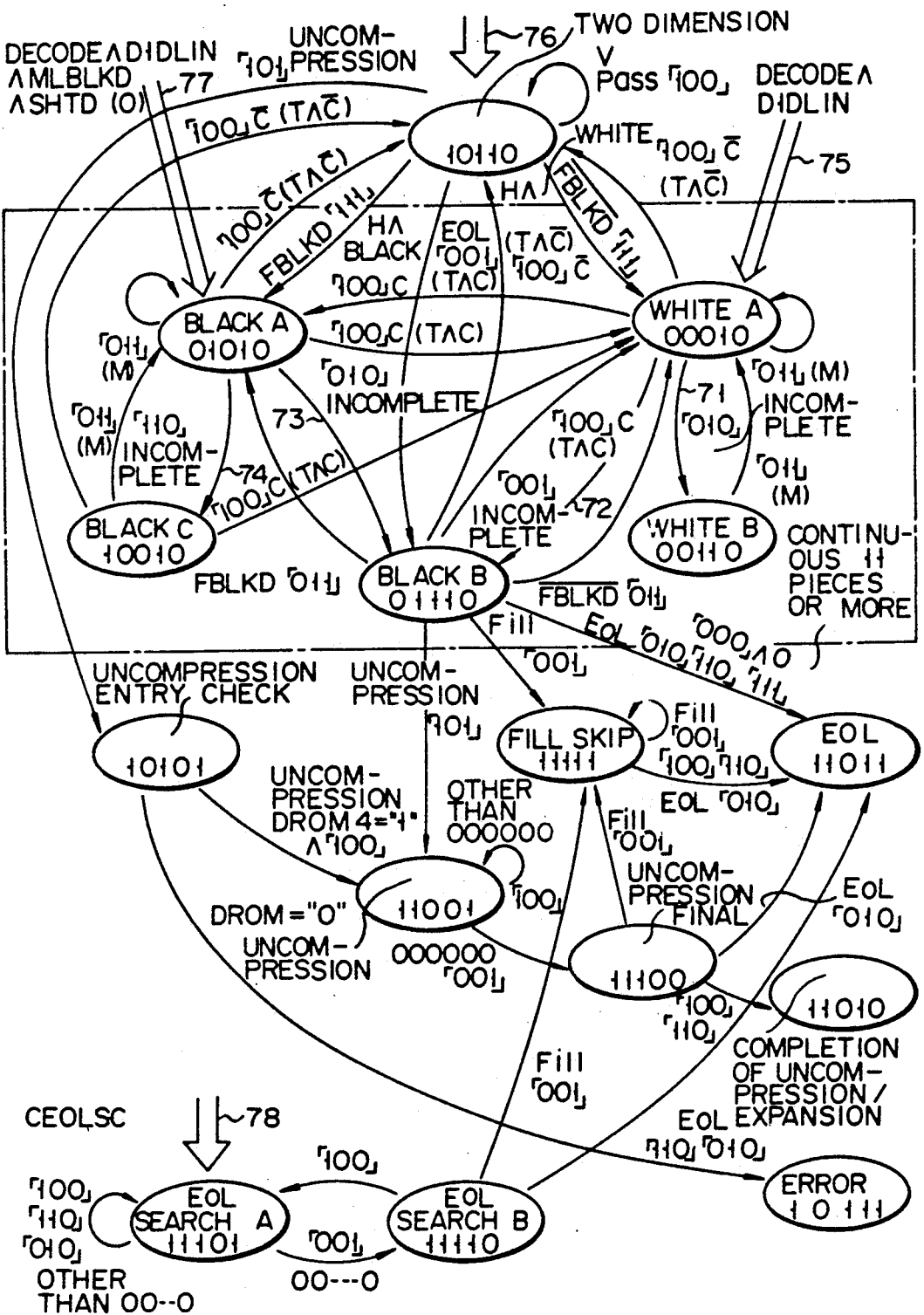
F I G. 10

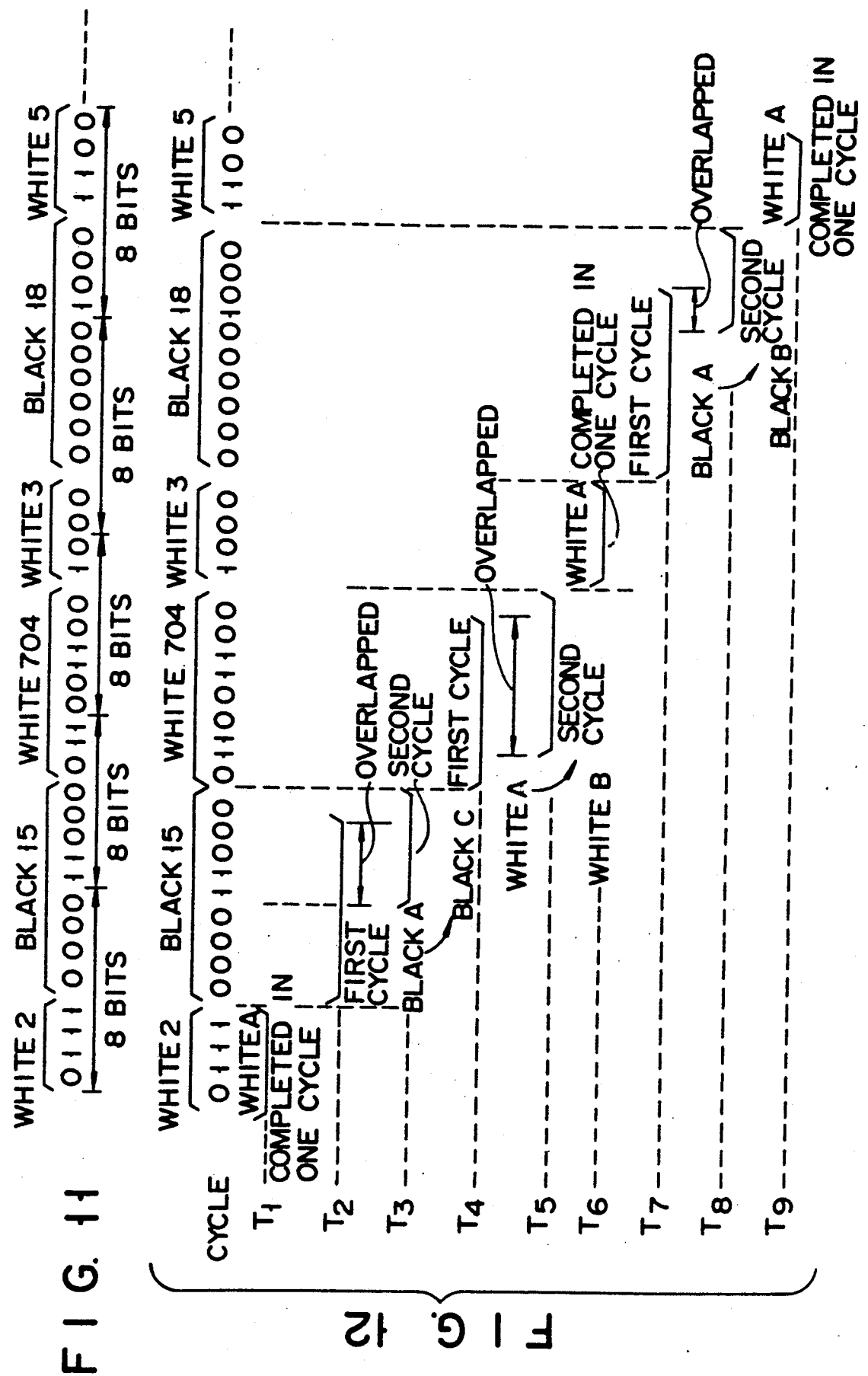

| FIG. | | T1 | T2 | T3 | T4 | T5 | T6 | T7 | T8 | T9 |
|---|---|---|---|---|---|---|---|---|---|---|
| FIG. 13A | CYCLE | | | | | | | | | |
| FIG. 13B | REGISTER 11U POINTER 13 | P↓ 7 0 01110000 | P↓ 7 0 01110000 | P↓ 7 0 11000011 | P↓ 7 0 11000011 | P↓ 7 0 01000001 | P↓ 7 0 00100010 | P↓ 7 0 00000000 | P↓ 7 0 10001100 | P↓ 7 10001100 |
| FIG. 13C | REGISTER 11L | 15 8 11000011 | 15 8 11000011 | 15 8 00100010 | 15 8 00100010 | 15 8 00100010 | 15 8 00000000 | 15 8 00000000 | 15 8 ////// | 15 8 ////// |
| FIG. 13D | SEQUENCER 15 | WHITE A STATUS | BLACK A STATUS | BLACK C STATUS | WHITE A STATUS | WHITE B STATUS | WHITE A STATUS | BLACK A STATUS | BLACK B STATUS | WHITE A STATUS |
| FIG. 13E | UPPER INPUT OF D-PLA | ⌈000⌋ | ⌈010⌋ | ⌈100⌋ | ⌈000⌋ | ⌈001⌋ | ⌈000⌋ | ⌈010⌋ | ⌈011⌋ | ⌈000⌋ |
| FIG. 13F | LOWER INPUT OF D-PLA | 01110000 0000110 | 00001100 | 11000011 | 01100110 | 10011001 | 10000000 | 00000010 | 10001100 | 1100---- |
| FIG. 13G | TABLE TO BE USED | TBL 0 | TBL 2 | TBL 4 | TBL 0 | TBL 1 | TBL 0 | TBL 2 | TBL 3 | TBL 0 |
| FIG. 13H | DECODING STATUS AND DECODED PORTION | COMPLETED IN ONE CYCLE 0111 0000 | FIRST CYCLE 00000 | SECOND CYCLE 01000 01 | FIRST CYCLE 01100 110 | SECOND CYCLE 1001 1001 | COMPLETED IN ONE CYCLE 1000 0000 | FIRST CYCLE 000000 | SECOND CYCLE 10 1000 1100 | COMPLETED IN ONE CYCLE 1100 |
| FIG. 13I | CODE LENGTH−1 | 3 | 3 | 4 | 1 | 6 | 3 | 5 | 3 | 3 |
| FIG. 13J | | ⌈100⌋ | ⌈110⌋ | ⌈100⌋ | ⌈010⌋ | ⌈011⌋ | ⌈100⌋ | ⌈010⌋ | ⌈100⌋ | ⌈100⌋ |
| FIG. 13K | STATUS DATA | 4 | 0 | 5 | 7 | 6 | 2 | 0 | 4 | 0 |
| FIG. 13L | OUTPUT OF ADDER CARRY FROM ADDER | ABSENCE ABSENCE | PRESENCE ABSENCE | ABSENCE ABSENCE | ABSENCE ABSENCE | PRESENCE ABSENCE | PRESENCE PRESENCE | PRESENCE PRESENCE | PRESENCE ABSENCE | ABSENCE PRESENCE |

VARIABLE LENGTH CODE PARALLEL DECODING APPARATUS AND METHOD

BACKGROUND OF THE INVENTION

1. Field of the Invention

The present invention relates to a variable length code decoding apparatus and method suitable for parallel decoding of a variable length code.

2. Description of the Related Art

In a conventional variable length code parallel decoding apparatus, when a variable length code is parallelly decoded, data to be decoded is parallelly extracted from a code bit string forming the variable length code into a register, and is input to an address circuit, as disclosed in U.S. Pat. No. 3,883,847. A first table (decoding result data table) is accessed using the data input to the address circuit as an address (entry address). Data associated with a decoding result (decoding result data) is set at each entry of this table. The start position of a code to be decoded (the decoding start bit position in a code bit string) can be detected on the basis of a "code length" included in the decoding result data.

In the known variable length code decoding apparatus, since codes which frequently appear normally have a small code length (smaller than a length of data input to the address circuit), they can be decoded within one cycle. In contrast to this, since codes which do not frequently appear normally have a large code length (exceeding a length of data input to the address circuit), they are decoded in two cycles. For example, for codes encoded by an MH (Modified Huffman) method, an MR (Modified READ) method, or an MMR (Modified MR) method, if data input to the address circuit is assumed to have an 8-bit length, two-dimensional codes and one-dimensional codes having a code length of 8 bits or less can be decoded within one cycle. However, one-dimensional codes having a code length of 9 bits or more require two or more cycles for decoding. A maximum code length of a one-dimensional code is 9 bits for a white code (white run code), and 13 bits for a black code (black run code).

When decoding is performed in two cycles in the known variable length code decoding apparatus, the length of a portion to be decoded in the first cycle of the total code length is fixed (e.g., 8 bits), and the remaining portion is decoded in the second cycle. In the decoding apparatus, a plurality of second tables are prepared for decoding in the second cycle, and one of the second tables is designated on the basis of predetermined data in entry data of the first table obtained in the first cycle, i.e., decoding result data indicating a partial (fixed length) decoding result (intermediate decoding result). Since the predetermined data corresponds to a state of the partial decoding result, it can be regarded as a kind of status data.

In the conventional variable length code decoding apparatus disclosed in U.S. Pat. No. 3,883,847, when parallel decoding of a variable length code is performed in two cycles, in, e.g., an 8-bit machine, 8 bits from the start bit of an objective code are partially decoded in the first cycle, and the remaining bits are decoded in the second cycle using status data indicating the partial decoding result. For this reason, when the prior art is applied to an 8-bit/cycle variable length code decoding apparatus which processes MH-, MR-, or MMR-encoded codes described in the CCITT (Comité Consultatif International Télégraphique et Téléphonique) recommendations T.4 and T.6, for example, when a one-dimensional code of binary image data is to be decoded, status data indicating the partially decoded result in the first cycle (used for decoding in the second cycle) requires 10 states for a white code (indicated by white B through white K in FIGS. 1A through 3) and status data for 8 states for a black code (indicated by black B through black I in FIGS. 1A through 3), as can be seen from code tables shown in FIGS. 1A through 3. In the prior art, since the number of types of states to be transferred from the first cycle to the second cycle is very large, the size of the decoding result data becomes large, resulting in an increase in the number of decoding result data tables.

SUMMARY OF THE INVENTION

It is an object of the present invention to provide a variable length code decoding apparatus and method, wherein when a variable length code having a large code length is decoded in two cycles, the number of types of status data transferred to the second cycle based on the partial decoding result in the first cycle can be decreased, so that a hardware volume can be reduced, and a hardware arrangement can be simplified.

According to a first aspect of the present invention, there is provided a variable length code parallel decoding apparatus for parallelly extracting a decoding objective code bit string from a code bit string constituting a variable length code and for performing a decoding in one cycle or plurality of cycles, said apparatus comprises: pointer means for designating a start position of the decoding objective code bit string; decoding means for decoding the decoding objective code bit string on the basis of a code bit string having a start bit at a bit position designated by the pointer means and a present cycle state, outputting decoding result data including a decoding result, code length data indicating a length of the decoded code bit string, and status data which is used for determining a next cycle state, determining, as a decoded portion, a portion of the decoding objective code bit string starting from the start bit of the variable length code requiring two cycles in decoding, and outputting the code length data corresponding to the decoded portion; sequencer means for determining the next cycle state on the basis of the status data in the decoding result data output from the decoding means and the present cycle state; and pointer updating means for updating a content of the pointer means on the basis of the code length data in the decoding result data output from the decoding means and the content of the pointer means.

According to a second aspect of the present invention, there is provided a variable length code parallel decoding method of parallelly extracting a decoding objective code bit string from a code bit string constituting a variable length code and performing decoding in one cycle or a plurality of cycles, said method comprises the steps of: a) designating a start position of the decoding objective code bit string; b) decoding the decoding objective code bit string on the basis of a code bit string having a start bit at a bit position designated by the step a) and a present cycle state, outputting decoding result data including a decoding result, code length data indicating a length of the decoded code bit string, and status data which is used for determining a next cycle state, determining, as a decoded portion, a portion of the decoding objective code bit string starting from the start bit of the variable length code requiring two cycles in decoding, and outputting the code length data corresponding to the decoded portion; c) determining the next cycle state on the basis of the status data in the decoding result data output in the step b) and the present cycle state; and d) updating a start position of the code bit string on the basis of the code length data in the decoding result data output in the step c) and the start position of the code bit string obtained in step a).

The variable length code parallel decoding method of the present invention is characterized in that when parallel decoding of a variable length code requires two cycles, i.e., first and second cycles, portions of code bit strings of the variable length code as objects to be decoded in the first and second cycles overlap each other. In this method, the length of the code bit string actually decoded in the first cycle is determined to be equal to one excluding the length of the overlapping portion of the code bit string as the object to be decoded in the first cycle, thereby determining the start position of the code bit string as an object to be decoded in the second cycle.

The variable length code parallel decoding apparatus of the present invention comprises a decoder for decoding a code bit string as an object to be decoded on the basis of a decoding objective code bit string extracted in accordance with designation of a pointer for indicating the start position of the code bit string and a state of the present cycle, and outputting decoding result data having code length data indicating the length of the decoded code bit string, and status data which is given for determination of the state of the next cycle, a sequencer for determining the state of the next cycle on the basis of the status data in the decoding result data output from the decoder and the state in the present cycle, and a pointer updating unit for updating the content of the pointer on the basis of the code length data in the decoding result data output from the decoder and the content of the pointer. When a code bit string as an object to be decoded is a portion starting from the start bit of a variable length code requiring two cycles in decoding, only a portion of the code bit string is processed as the decoded portion in the decoder, and code length data corresponding to the decoded portion is output to the pointer updating unit.

According to the variable length code decoding method of the present invention, when a variable length code requires two cycles in decoding, since portions of code bit strings serving as objects to be decoded in the first and second cycles are caused to overlap each other, only a non-overlapping portion can be determined as a decoded portion in the first cycle. Therefore, as compared to a conventional method wherein the entire code bit string as an object to be decoded in the first cycle is always determined to be a decoded portion, the number of types of states corresponding to the decoding results to be transferred to the second cycle can be decreased.

According to the variable length code decoding apparatus of the present invention, the code length data in the decoding result data output from the decoder upon decoding in the decoder is supplied to the pointer updating unit. The start position of a code bit string serving as an object to be decoded in the next cycle (the second cycle for a variable length code requiring two cycles in decoding) is determined on the basis of the code length data and the present content of the pointer, and the content of the pointer is updated. According to the present invention, when a code bit string as an object to be decoded is a portion starting from the start bit of a variable length code requiring two cycles in decoding, only a portion of the code bit string is processed as the decoded portion in the decoder, and code length data corresponding to the decoded portion is output to the pointer updating unit. Therefore, when the content of the pointer is updated using this code length, a code bit string as an object to be decoded, which starts from the bit position indicated by the pointer, overlaps a portion of the code bit string as the object to be decoded in the immediately preceding cycle (first cycle), which is not determined as a decoded portion. In the next cycle (second cycle), the code bit string as the object to be decoded is decoded on the basis of the code bit string having the overlapping portion, and the state of the new cycle (second cycle) determined based on the state of the immediately preceding cycle (first cycle) and status data transferred from the decoder by decoding processing in the immediately preceding cycle, thus outputting corresponding decoding result data. The code length data in this decoding result data indicates an actually decoded code length (i.e., of a variable length code requiring two cycles in decoding, a code length excluding the portion determined as the decoded portion in the first cycle), and the start position of a code bit string as an object to be decoded in the next cycle is determined. In this manner, according to the present invention, when a variable length code requires two cycles in decoding, portions of code bit strings serving as objects to be decoded in the first and second cycles of the variable length code can overlap each other, resulting in a decrease in the number of types of states transferred to the second cycle. Furthermore, the above-mentioned constituting elements can be similarly operated both in the case of a variable length code completing decoding in one cycle and in the case of a variable length code completing decoding in two cycles.

BRIEF DESCRIPTION OF THE DRAWINGS

FIGS. 1A, 1B, 2, and 3 show code tables for explaining conventional problems;

FIG. 4 is a block diagram showing an embodiment of a variable length code parallel decoding apparatus according to the present invention;

FIG. 5 is a table for explaining a correspondence between a plurality of tables realized by a D-PLA shown in FIG. 4, and an input (upper 3 bits) to the D-PLA;

FIG. 6 shows a format of decoding result data as an output from the D-PLA;

FIGS. 7A, 7B, 8, and 9 show a code table for explaining classification of MH codes;

FIG. 10 is a state transition chart of a sequencer shown in FIG. 4;

FIG. 11 shows an example of a variable length code string serving as an object to be decoded in the apparatus shown in FIG. 4;

FIG. 12 is a timing chart for explaining a decoding sequence of the variable length code string shown in FIG. 11; and FIGS. 13A, 13B, 13C, 13D, 13E, 13F, 13G, 13H, 13I, 13J, 13K, and 13L are timing charts showing states and the like of the respective units in the decoding sequence of the variable length code string.

DETAILED DESCRIPTION OF THE PREFERRED EMBODIMENT

FIG. 4 is a block diagram of a variable length code decoding apparatus according to an embodiment of the present invention. The variable length code decoding apparatus shown in FIG. 4 partially constitutes a binary image compression/expansion (codec) LSI. Reference numeral 11 denotes a register for holding, as input data, 16 bits of a code bit string forming a variable length code string as an object to be decoded. The register 11 comprises a lower 8-bit register $11_L$ for receiving and holding 8 bits from the code bit string, and an upper 8-bit register $11_U$ for, when 8 bits are input to the register $11_L$, receiving and holding the previous holding content of the register $11_L$. Reference numeral 12 denotes a funnel shifter for extracting a code or code portion to be decoded (code bit strings constituting it) by 8 bits from the start bit from the output (16 bits) from the register 11; and 13, a pointer (P) for indicating the start position to be extracted (i.e., decoding start bit position) of the funnel shifter 12. The pointer 13 comprises a 3-bit register (pointer register).

Reference numeral 14 denotes a table memory means, e.g., a decode PLA (Programmable Logic Array) for realizing decoding result data tables TBL0 through TBL7. The decode PLA (to be referred to as a D-PLA hereinafter) 14 receives data (11 bits) obtained by linking the output (3 bits) from a sequencer 15 (to be described below) and the output (8 bits) from the funnel shifter 12 (3 bits from the sequencer 15 serve as upper bits). The decoding result data table TBLi (i=0 through 7) in the D-PLA 14 is designated by upper 3 bits of the input, i.e., the output from the sequencer 15, and an entry in the table TBLi is designated by lower 8 bits of the input, i.e., the output from the funnel shifter 12. The output (3 bits) from the funnel shifter 12 serve as upper 3 bits of 5-bit data indicating the state of the sequencer 15.

FIG. 5 shows the correspondence between the tables TBL0 through TBL7 and the upper 3 bits (3-bit output of the sequencer 15) in correspondence with the assignments of the tables TBL0 through TBL7. As can be seen from FIG. 5, the tables TBL0 through TBL4 are used for decoding of a one-dimensional code. The table TBL is used for decoding all the one-dimensional white codes in the first cycle (to be referred to as a white A state hereinafter), and the table TBL1 is used for decoding a one-dimensional white code of type 2 (to be described later) in the second cycle (to be referred to as a white B state hereinafter). The table TBL2 is used for decoding all the one-dimensional black codes in the first cycle (to be referred to as a black A state). The table TBL3 is used for decoding a one-dimensional white code of type 3 or a one-dimensional black code of type 2 (to be described later) in the second cycle (to be referred to as a black B state hereinafter). The table TBL4 is used for decoding a one-dimensional black code of type 3 (to be described later) in the second cycle (to be referred to as a black C state hereinafter). The table TBL5 is used for decoding a two-dimensional code, the table TBL6 is used for decoding a non-compressed mode code, and the table TBL7 is used for decoding special codes, e.g., EOL (End of Line) (e.g., EOL search).

The decoding result data as a content of the output for the input of the D-PLA 14, i.e., the entry data of the decoding result table TBLi consists of a 6-bit run length (run length data) as a decoding result, 3-bit code length data (code length −1) obtained by subtracting 1 from an actually decoded code length (decoded code length) of 8 bits input from the funnel shifter 12 to the D-PLA 14 as an object to be decoded, and 3-bit status data indicating a state of the decoding result, as shown in FIG. 6. Note that the value of the code length −1 is used in place of the code length (decoded code length) to decrease the number of necessary bits. More specifically, when the code length −1 is used, the decoded code length even at maximum (8 bits) can be expressed by 3 bits. There are eight types of 3-bit status data in the decoding result data, i.e., "000" to "111". The status data directly associated with the present invention are those obtained upon decoding of a one-dimensional code requiring two cycles in decoding, and are 5 types, i.e., "100", "011", "010", "001", and "110".

Prior to description of the five types of status data, classification of codes of the MH method (MH codes) in this embodiment will be described below with reference to FIGS. 7A through 9. FIGS. 7A and 7B show Terminating code (to be referred to as T code hereinafter) tables, FIG. 8 shows a Make-up code (to be referred to as M code hereinafter) table, and FIG. 9 shows an M code table common to black and white codes. In this embodiment, each of black and white codes is classified into three types, i.e., types 1 through 3. Definitions of the types 1 through 3 will be described below for white and black codes.

(a) White Code

Type 1...Code having a code length of 8 bits or less (i.e., which can be decoded within one cycle in this apparatus)

Type 2...Code having a code length of 9 bits or more (i.e., which requires two cycles in decoding in this apparatus), and including two bits ="01" from the start bit of the code Type 3...Code having a code length of 9 bits or more, and including 6 bits =all "0"s from the start of the code (this code is common to a black code, as shown in FIG. 9)

(b) Black Code

Type 1...Code having a code length of 7 bits or less

Type 2...Code having a code length of 8 bits or more, and including 6 bits =all "0"s from the start bit of the code Type 3...Code having a code length of 8 bits or more, including 4 bits =all "0"s from the start bit of the code, and excluding codes of type 2

The definitions of the five types of status data described above will be summarized below.

"100"...Status data indicating that decoding of a T code is completed

"011"...Status data indicating that decoding of an M code is completed

"010"...For decoding of a white code, status data indicating that decoding of a white code of type 2 is not completed yet (i.e., the second decoding cycle of the white code of type 2 follows), and for decoding of a black code, status data indicating that decoding of a black code of type 2 is not completed yet (i.e., the second decoding cycle of the black code of type 2 follows)

"001"...Status data indicating that decoding of a white code of type 3 is not completed yet (i.e., the second decoding cycle of the white code of type 3 follows)

"110"...Status data indicating that decoding of a black code of type 3 is not completed yet (i.e., the second decoding cycle cf the black code of type 3 follows)

In the code tables shown in FIGS. 7A through 9, a frame indicated by "white A" or "black A" having a lateral size corresponding to an 8 or 7 bit length indicates that a code or a code portion in the frame serves as an object to be decoded in the white A or black A state. A code of type 1 falling within the white A or black A frame (a code having a code length of 8 bits or 7 bits or less) can be decoded in only the white A or black A state (i.e., in one cycle), and a code of type 2 or 3 which cannot fall within the white A or black A frame (a code having a code length of 9 bits or 8 bits or more) requires the next state of the white A or black A state for its decoding (i.e., requires two cycles).

For a code requiring two cycles in decoding, when all the 8 bits are determined as a decoded portion in the white A or black A state, and the remaining bits are decoded in the second cycle like in the prior art, the number of types of 8-bit code portion determined as a decoded portion in the first cycle is 10 for a white code and 8 for a black code. More specifically, in the conventional method, the number of types of states (status data) to be transferred from the first cycle to the second cycle is 10 for a white code, and 8 for a black code. In contrast to this, in this embodiment, as can be seen from code portions surrounded by frames indicated by "white B", "black B", and "black C", a portion serving as an object to be decoded in the white A or black A state (first cycle) and a portion to be an object to be decoded in the next white B, black B, or black C state partially overlap each other (an overlapping portion of the frames). More specifically, in this embodiment, the entire code portion serving as an object to be decoded in the white A or black B state is not determined as a decoded portion. That is, only a portion which does not overlap is determined as a decoded portion in the next state, and the remaining portion including the overlapping portion is decoded in the second cycle. Therefore, the number of types of a code portion determined as a decoded portion in the first cycle is one for a white code, i.e., type 2 (two on the code tables but one out of two is common to a black code), and two for a black code, i.e., types 2 and 3, as can be seen from the code tables shown in FIGS. 7A through 9.

For a code requiring two cycles in decoding (codes of types 2 and 3), a portion partially determined as a decoded portion in the first cycle is as follows, as can be seen from the above description and FIGS. 7A through 9. Note that the code length −1 and the status data (status data to be transferred to the second cycle) in the decoding result data output from the D-PLA 14 in this case will be described together.

(a) White Code

Type 2...Two bits = "01" from the start bit are determined as a decoded portion. That is, when a code bit string as an object to be decoded in the white A state is 8 bits from the start bit of a white code of type 2, only the starting two bits are determined as a decoded portion. For this reason, of entries in the table TBL0 used in the white A state, the code length −1 in the decoding result data at an entry designated by 8 bits from the start bit of the white code of type 2 is set to be 1, and the status data is set to be "010".

Type 3...Six bits = "000000" from the start bit are determined as a decoded portion. That is, when a code bit string as an object to be decoded in the white A state is 8 bits from the start bit of a white code of type 3, only the starting 6 bits are determined as a decoded portion. For this reason, of entries in the table TBL0 used in the white A state, the code length −1 in the decoding result data at an entry designated by 8 bits from the start bit of the white code of type 3 is set to be 5, and the status data is set to be "001".

(b) Black Code

Type 2...Six bits = "000000" from the start bit are determined as a decoded portion. That is, when a code bit string as an object to be decoded in the black A state is 8 bits from the start bit of a black code of type 2, only the starting 6 bits are determined as a decoded portion. For this reason, of entries in the table TBL2 used in the black A state, the code length −1 in the decoding result data at an entry designated by 8 bits from the start bit of the black code of type 2 is set to be 5, and the status data is set to be "Q10".

Type 3...Four bits = "0000" from the start bit are determined as a decoded portion. That is, when a code bit string as an object to be decoded in the black A state is 8 bits from the start bit of a black code of type 3, only the starting 4 bits are determined as a decoded portion. For this reason, of entries in the table TBL2 used in the black A state, the code length −1 in the decoding result data at an entry designated by 8 bits from the start bit of the black code of type 3 is set to be 3, and the status data is set to be "110".

Referring again to FIG. 4, reference numeral 15 denotes a sequencer for determining upper 3 bits of the input of the D-PLA 14. The sequencer 15 determines its own state in the next cycle on the basis of its own present state (in other words, the state of the present cycle) and the status data in the decoding result data output from the D-PLA 14. The state of the sequencer 15 is represented by five flip-flops (to be referred to as F/Fs hereinafter) 15a. 5-bit- data indicated by the F/Fs 15a is output from the sequencer 15, and is used for designating the decoding result table TBLi in the D-PLA 14. Reference numeral 16 denotes an adder for adding a value (bit position) indicated by the pointer 13 (bit position) to the code length data (code length −1) in the decoding result data output from the D-PLA 14 to calculate the next decoding start bit position. The adder 16 receives a carry to correct the code length data from which 1 is subtracted. The carry output from the adder 16 is used for transferring the holding content of the register 11$_L$ to the register 11$_U$, and for instructing input of next 8 bits to the register 11$_L$ from a variable length code string serving as an object to be decoded.

FIG. 10 shows all the available states of the sequencer 15 shown in FIG. 4 (excluding a reset state). In FIG. 10, each state of the sequencer 15 is represented by 5-bit data. Especially, in FIG. 10, an area surrounded by an alternate long and one short dashed frame includes major available states of the sequencer 15 upon decoding of a one-dimensional code directly related to the present invention, i.e., five states of the white A, white B, black A, black B, and black C states. Symbols in FIG. 10 will be summarized below.

DECODE...Signal indicating a decoding mode of a variable length code

D1DLIN...Signal indicating decoding of a one-dimensional code (when "1") or a two-dimensional code (when "0")

MLBLKD...Signal indicating return from a noncompressed mode code to a normal code SHTD(0)...Indicates an output of a bit "7" of the funnel shifter. A tag (T) bit is added to an identification code indicating return from the non-compressed mode code, and a bit indicated by the signal SHTD(0) serves as a tag bit indicating that the next code is black or white ("1" =black).

FBLKD...Signal indicating whether a decoded code is a black code (when "1") or a white code (when "0")

CEOLSC...Signal for instructing search of an EOL code

M...Indicates a decoding end state ("011") of the M code

T...Indicates a decoding end state ("001") of the T code

H...Indicates a decoding end state ("111") of an H code (a two-dimensional code in a horizontal mode)

C...Signal indicating that of two one-dimensional codes following the H code, the second one-dimensional code is to be decoded (when "0"); in decoding of other codes (including decoding of the first one-dimensional code), always set to be "1"

As can be seen from FIG. 10, in this embodiment, when the status data output from the D-PLA 14 in the white A state is "010", i.e., when the first decoding of a white code of type 2 is performed, a state transits to the white B state, as indicated by a bold arrow 71. When the status data output from the D-PLA 14 in the white A state is "001", i.e., when the first decoding of a white code of type 3 is performed, a state transits to the black B state, as indicated by a bold arrow 72. On the other hand, when the status data output from the D-PLA 14 in the black A state is "010", i.e., when the first decoding of a black code of type 2 is performed, a state transits to the black B state, as indicated by a bold arrow 73. When the status data output from the D-PLA 14 in the black A state is "110", i.e., when the first decoding of a black code of type 3 is performed, a state transits to the black C state, as indicated by a bold arrow 74. Arrows denoted by reference numerals 75 to 78 indicate that the state indicated by the corresponding arrow is set under the control of a microprogram control mechanism (main sequencer).

The operation according to the embodiment of the present invention, e.g., parallel decoding of an MH code string shown in FIG. 11 will be described below with reference to FIG. 12 and FIGS. 13A through 13L. Note that FIG. 12 is a timing chart for briefly explaining a decoding sequence of a code string shown in FIG. 11, and FIGS. 13A through 13L are timing charts showing in detail states of the respective units in the decoding sequence of the code string shown in FIG. 11.

The code string shown in FIG. 11 consists of, from the start bit, a T code of a white code indicating a white run length =2, a T code of a black code indicating a black run length =15, an M code of a white code indicating a white run length =704, a T code of a white code indicating a white run length =3, and a T code of a black code indicating a black run length =18,.... Upon decoding of the above-mentioned MH code string, the state of the sequencer 15 (indicated by the F/Fs 15a) is set to be the white A state represented by "00010" under the control of the microprogram control mechanism (not shown). The pointer 13 is cleared to indicate a bit "0", and its content is "000". In this state, an 8-bit code bit string including the white code (type 1 code) of the T code indicating the white run length =2 from the start bit of the MH code string shown in FIG. 11 is loaded in the lower-bit register $11_L$ of the register 11. Subsequently, the starting 8 bits loaded in the register $11_L$ are transferred to the upper-bit register $11_U$, and the following 8-bit code bit string is loaded in the register $11_L$. More specifically, of the code string (code bit strings constituting it) in FIG. 11, 16 bits from the start bit are held in the register 11.

The 16-bit code bit string held in the register 11 is input to the funnel shifter 12. The funnel shifter 12 extracts 8 bits (in this case, 8 bits starting from a 4-bit white code indicating a white run length =2) having a start bit at a bit position indicated by the pointer 13 as a code bit string serving as an object to be decoded, and supplies it to lower bits of the 11-bit input of the D-PLA 14. Note that in the holding contents of the registers $11_U$ and $11_L$ shown in FIGS. 13A through 13L, a code bit string extracted from the register 11 (or the registers $11_U$ and $11_L$ constituting it) by the funnel shifter 12 is indicated by hatching. Upper bits of the 11-bit input of the D-PLA 14 receive upper 3 bits (in this case, "000") of the 5-bit data indicating the state of the sequencer 15. As a result, the decoding result data table TBLi corresponding to a value i (0 ≦ i ≦ 7) indicated by the upper 3 bits (3-bit output from the sequencer 15) of the input of the D-PLA 14 is designated, and a corresponding entry in the table TBLi is designated by lower 8 bits of the input of the D-PLA 14 (i.e., a code bit string as an object to be decoded, i.e., the 8-bit output from the funnel shifter 12). Thus, 12-bit decoding result data (FIG. 6) as data at the designated entry is output from the D-PLA 14.

With the above operation, in a first decoding cycle T1 for the code string shown in FIG. 11 as an object, of the entries of the table TBL0 corresponding to the white A state, decoding result data at an entry designated by an 8-bit code bit string "01110000" to be decoded including a white code "0111" of the T code indicating a white run length =2 is output. The decoding result data consists of a run length indicated by a decoded code, a code length −1 of an actually decoded code (or a code portion), and status data to be transferred to the next cycle, as shown in FIG. 6. In the case of "0111xxxx" (x can be either 0 or 1) like the above-mentioned code bit string, 2 as the run length, 3 as the code length −1, and "100" indicating that decoding of the T code is completed as the status data are set at the corresponding entry of the table TBL0.

Of the decoding result data output from the D-PLA 14 in the cycle T1, the status data "100" is supplied to the sequencer 15. Thus, the state of the sequencer 15 transits from the white A state to the black A state represented by "01010" (since C =1; FIG. 10). Of the decoding result data, the code length −1 (3) is supplied to the adder 16. The adder 16 adds the code length −1 to the present value of the pointer 13. A carry input terminal (CI) of the adder 16 receives a carry. Therefore, the adder 16 adds the code length (4) of the decoded code (in this case, the white code indicating a white run length =2) to the value (0) of the pointer 13, thus yielding 4. The sum (=4) output from the adder 16 is set in the pointer 13 to indicate the decoding start bit position in the next cycle T2.

In the cycle T2, since the content of the pointer 13 is 4, 8 bits starting from a bit "4", of a 16-bit code bit string output from the register 11, i.e., the starting 8 bits "00001100" of the black code (type 3) of the T code indicating a black run length =15 are extracted by the funnel shifter 12 as a code bit string as an object to be decoded, and are supplied to the D-PLA 14. The D-PLA 14 also receives upper 3 bits "010" of the 5-bit data indicating the state of the sequencer 15. As a result, of entries in the table TBL2 corresponding to the black A state designated by "010", decoding result data at an entry designated by the code bit string "00001100" to be decoded is output from the D-PLA 14. When the code bit string to be decoded corresponds to 8 bits from the start bit of the black code of type 3, as described above, 3 (=4−1) as the code length −1 (i.e., a value indicating that only starting 4 bits of 8 bits "0000xxxx" from the start bit of the black code of type 3 correspond to a decoded portion), and "110" indicating that decoding of the black code of type 3 is not completed yet as the status data are set at the corresponding entry of the table TBL2. Of other entries of the table TBL2 used in the black A state, the same applies to an entry designated by 8 bits from the start bit of the black code of type 3. As a run length, for example, 0 (or data indicating invalidity) is used. Note that the maximum number of bits necessary for decoding in the black A state is 7 (FIGS. 7A through 9). Therefore, in the black A state, another D-PLA which receives 10 bits consisting of 3 bits from the sequencer 15 and 7 bits obtained by excluding the least significant bit of an 8-bit code bit string to be decoded can be used. Thus, the D-PLA can be simplified as compared to a case wherein only the 11-bit input D-PLA 14 is used.

When the status data output from the D-PLA 14 in the cycle T2 is "110", the state of the sequencer 15 transits from the black A state to the black C state represented by "10010" (FIG. 10). When the code length −1 output from the D-PLA 14 is 3, the adder 16 adds 3+1 to the present value 4 of the pointer 13. In this case, the sum from the adder 16 becomes 0, and a carry is output from a carry output terminal (CO) of the adder 16. As a result, the value of the pointer 13 is updated to 0. An 8-bit code bit string held in the register 11$_L$ (in this case, 8 bits starting from a portion "1100" of a black code of a run length =15 which is not decoded in the cycle T2) is transferred to the register 11$_U$, and the next 8 bits "00110010" from the variable length code string shown in FIG. 11 are input to the register 11$_L$.

In the next cycle T3, since the content of the pointer 13 is 0, 8 bits starting from a bit "0" of the 16-bit code bit string output from the register 11, i.e., 8 bits "11000011" starting from the remaining portion "11000" including a non-decoded portion in the cycle T2 are extracted by the funnel shifter 12 as a code bit string to be decoded. In the cycle T3, upper 3 bits of the 5-bit data indicating the state of the sequencer 15 are "100". In this case, of entries in the table TBL4 corresponding to the black C state designated by "100", decoding result data at an entry designated by the code bit string "11000011" to be decoded is output from the D-PLA 14. When the code bit string to be decoded is "11000xxx" as described above, 15 as the run length, 4 as the code length −1, and "100" indicating completion of decoding of the T code as the status state are set at the corresponding entry of the table TBL4.

In the cycle T3, when the status data output from the D-PLA 14 is "100", the state of the sequencer 15 transits from the black C state to the white A state represented by "00010" (since C =1; FIG. 10). When the code length −1 output from the D-PLA 14 is 4, the adder 16 adds 4+1 to the present value 0 of the pointer 13. In this case, the sum from the adder 16 becomes 5 and the value of the pointer 13 is updated to 5.

In the next cycle T4, since the content of the pointer 13 is 5, 8 bits starting from a bit "5" of the 16-bit code bit string output from the register 11, i.e., starting 8 bits "01100110" of the white code (type 2) of the M code having a white run length =704 are extracted by the funnel shifter 12 as a code bit string to be decoded. In the cycle T4, upper 3 bits of the 5-bit data indicating the state of the sequencer 15 are "000". In this case, of entries in the table TBL0 corresponding to the white A state designated by "000", decoding result data designated by the code bit string "01100110" to be decoded is output from the D-PLA 14. When the code bit string to be decoded is starting 8 bits of the white code of type 2, 1 (=2−1), as the code length −1 (i.e., a value indicating that only starting 2 bits "01" of starting 8 bits "01xxxxxx" of the white code of type 2 correspond to a decoded portion), and "010" indicating that decoding of the white code of type 2 is not completed yet as the status data are set at the corresponding entry of the table TBL0. Of other entries of the table TBL0 used in the white A state, the same applies to an entry designated by 8 bits from the start bit of the white code of type 2. As a run length, for example, 0 (or data indicating invalidity) is used.

When the status data output from the D-PLA 14 in the cycle T4 is "010", the state of the sequencer 15 transits from the white A state to the white B state represented by "00110" (FIG. 10). When the code length −1 output from the D-PLA 14 is 1, the adder 16 adds 1+1 to the present value 5 of the pointer 13. In this case, the sum from the adder 16 becomes 7, and the value of the pointer 13 is updated to 7.

In the next cycle T5, since the content of the pointer 13 is 7, 8 bits starting from a bit "7" of the 16-bit- code bit string output from the register 11, i e., 8 bits "10011001" starting from the remaining portion "1001100" including a portion determined as a nondecoded portion in the cycle T4 are extracted by the funnel shifter 12 as the code bit string to be decoded. In the cycle T5, upper 3 bits of the 5-bit data indicating the state of the sequencer 15 are "001". In this case, of entries in the table TBL1 corresponding to the white B state designated by "001", decoding result data at an entry designated by the code bit string "10011001" to be decoded is output from the D-PLA 14. When the code bit string to be decoded is "1001100x" as described above, 11 as the run length (a multiplier corresponding to 64 for calculating an actual run length =704), 6 as the code length −1, and "011" indicating completion of decoding of the M code as the status data are set at the corresponding entry of the table TBL1.

When the status data output from the D-PLA 14 in the cycle T5 is "011", the state of the sequencer 15 transits from the white B state to the white A state represented by "00010" (FIG. 10). When the code length −1 output from the D-PLA 14 is 6, the adder 6 adds 6+1 to the present value 7 to the pointer 13. In this case, the sum from the adder 16 becomes 6, and a carry is output from the adder 16. As a result, the value of the pointer 13 is updated to 6. Since the carry is output from the adder 16, the 8-bit code string (in this case, 8 bits consisting of the code bit string to be decoded in the cycle T5 and the start bit of the next 4-bit white code (type 1) of the T code having a white run length =3) is transferred to the register 11$_U$, and the next 8 bits, i.e., 8 bits including the remaining portion of the white code having the white run length =3 are input from the variable length code shown FIG. 11 to the register 11$_L$. The same operation as described above is repeated.

In this embodiment, in the variable length code parallel decoding apparatus in which a code bit string to be decoded has a bit length of 8 bits, MH codes (one-dimensional codes) requiring two cycles in decoding are classified to codes (type 2 codes) including starting two bits ="01" and codes (type 3 codes) starting from "000000" for white codes, and are classified into codes (type 2 codes) including starting 6 bits ="000000" and codes (type 3 codes) starting from "0000" and excluding codes of type 2 for black codes. In the first cycle of decoding, the above-mentioned code portion of starting 8 bits of a code of type 2 or 3 to be decoded (a maximum code length is 9 bits for a white code and 13 bits for a black code) is processed as a decoded portion, and the remaining code portion including a non-decoded portion in the first cycle is decoded in the second cycle, so that the number of types of states (status data) to be transferred from the first cycle to the second cycle can be greatly decreased to two for a white code (actually one since one out of two is common to a black code) and two for a black code as compared to a conventional apparatus. However, the present invention is not limited to this. That is, when a variable length code requires two cycles in decoding, the number of types can be larger than that in the above embodiment as long as a code bit string to be decoded in the first cycle and a code bit string to be decoded in the second cycle partially overlap each other. In this case, the number of types of states to be transferred from the first cycle to the second cycle is increased to be larger than that in the above embodiment.

In the above embodiment, a PLA (D-PLA 14) is used as a decoding means. However, a memory such as a ROM may be used.

What is claimed is:

1. A variable length code parallel decoding apparatus for parallelly extracting a decoding objective code bit string from a code bit string constituting a variable length code and for performing decoding in one cycle or a plurality of cycles, comprising:
   pointer means for designating a start position of the decoding objective code bit string;
   decoding means for decoding the decoding objective code bit string on the basis of a code bit string having a start bit at a bit position designated by said pointer means and a present cycle state, outputting decoding result data including a decoding result, code length data indicating a length of the decoded code bit string, and status data which is used for determining a next cycle state, determining, as a decoded portion, a portion of the decoding objective code bit string starting from the start bit of the variable length code requiring two cycles in decoding, and outputting the code length data corresponding to the decoded portion;
   sequencer means for determining the next cycle state on the basis of the status data in the decoding result data output from said decoding means and the present cycle state; and
   pointer updating means for updating a content of said pointer means on the basis of the code length data in the decoding result data output from said decoding means and the content of said pointer means.

2. An apparatus according to claim 1, wherein if a bit length of the decoding objective code bit string is represented by $2^n$ bits, the content of said pointer means consists of n bits.

3. An apparatus according to claim 2, further comprising:
   $2^n$-bit first register means for sequentially receiving and holding a code bit string from the start bit of the variable length code in units of $2^n$ bits;
   second register means for, when a $2^n$-bit code bit string is input to said first register means, receiving and holding the $2^n$-bit code bit string already held in said first register means; and
   decoding objective code bit string extracting means for extracting $2^n$ bits having a start bit at a bit position designated by said pointer means as the decoding objective code bit string from a code bit string of $2 \times 2^n$ bits obtained by linking the output from said first register means to a lower-bit position of the output from said second register means and outputting the extracted code bit string to said decoding means.

4. An apparatus according to claim 3, wherein said pointer updating means includes an n-bit adder for adding a value indicated by the code length data output from said decoding means and the content of said pointer means to determine a new content of said pointer means.

5. An apparatus according to claim 4, further comprising means for, every time a carry is output from said adder, inputting the $2^n$-bit holding content of said first register means to said second register means and inputting a following new $2^n$-bit code bit string from the variable length code to said first register means.

6. An apparatus according to claim 1, wherein said decoding means comprises a plurality of table means each of which is designated in accordance with a state determined by said sequencer means, and includes entries each designated by the decoding objective code bit string, the decoding result data being set at each of said entries.

7. An apparatus according to claim 5, wherein said decoding means comprises a plurality of table means each of which is designated in accordance with a state determined by said sequencer means, and includes entries each designated by the decoding objective code bit string, the decoding result data being set at each of said entries.

8. A variable length code parallel decoding method of parallelly extracting a decoding objective code bit string from a code bit string constituting a variable length code and performing decoding in one cycle or a plurality of cycles, comprising the steps of:
   a) designating a start position of the decoding objective code bit string;
   b) decoding the decoding objective code bit string on the basis of a code bit string having a start bit at a bit position designated by the step a) and a present cycle state, outputting decoding result data including a decoding result, code length data indicating a length of the decoded code bit string, and status data which is used for determining a next cycle state, determining, as a decoded portion, a portion of the decoding objective code bit string starting from the start bit of the variable length code requiring two cycles in decoding, and outputting the code length data corresponding to the decoded portion;
   c) determining the next cycle state on the basis of the status data in the decoding result data output in the step b) and the present cycle state; and
   d) updating a start position of the code bit string on the basis of the code length data in the decoding result data output in the step c) and the start position of the code bit string obtained in step a).

9. A method according to claim 8, wherein if a bit length of the decoding objective code bit string is represented by $2^n$ bits, the step a) designates the start position of the code bit string with n bits.

10. A method according to claim 8, further comprising the steps of:
prior to the step b), sequentially receiving and holding a code bit string from the start bit of the variable length code in units of $2^n$ bits in a $2^n$-bit first register;
receiving and holding the $2^n$-bit code bit string already held in said first register in a second register when a $2^n$-bit code bit string is input to said first register; and
extracting $2^n$ bits having a start bit at a bit position designated in the step a) as the decoding objective code bit string from a code bit string of $2 \times 2^n$ bits obtained by linking the output from said first register to a lower-bit position of the output from said second register.

11. A method according to claim 10, further comprising the step of adding a value indicated by the code length data output in the step b) and the start position of the code bit string in the step a) to determine a new start position of the code bit string.

12. A method according to claim 11, further comprising the step of inputting the $2^n$-bit holding content of said first register to said second register and inputting a following new $2^n$-bit code bit string from the variable length code to said first register every time a carry is output upon addition of the values.

13. A method according to claim 8, wherein the step b) includes the step of accessing a plurality of tables each of which is selected in accordance with a cycle state determined in the step c), each of entries of the selected table being designated by the decoding objective code bit string so as to output decoding result data at the entry.

14. A method according to claim 12, further comprising the step of accessing a plurality of tables each of which is selected in accordance with a cycle state determined in the step c), each of entries of the selected table being designated by the decoding objective code bit string so as to output decoding result data at the entry.

15. A variable length code parallel decoding method of parallelly extracting a decoding objective code bit string from a code bit string constituting a variable length code and performing decoding in one cycle or a plurality of cycles, comprising the steps of:
a) detecting a decoding objective code bit string which requires the plurality of cycles for decoding; and
b) causing portions of code bit strings serving as objects to be decoded in the plurality of cycles of the variable length code to overlap each other in response to the detection of the decoding objective code bit string which requires the plurality of cycles for decoding.

16. A method according to claim 15, further comprising the step of determining a length of a code bit string actually decoded in a first cycle as a length of the code bit string serving as the object to be decoded in a first cycle excluding the length of the overlapping portion, and determining a start position of the code bit string serving as the object to be decoded in a second cycle on the basis of the determined length.

* * * * *